United States Patent [19]

Kim

[11] Patent Number: 5,319,225

[45] Date of Patent: Jun. 7, 1994

[54] OUTPUT TERMINAL OF A SOLID-STATE IMAGE DEVICE

[75] Inventor: Beom-Shik Kim, Suwon, Rep. of Korea

[73] Assignee: SamSung Electronics Co., Ltd., Suwon, Rep. of Korea

[21] Appl. No.: 953,189

[22] Filed: Sep. 29, 1992

Related U.S. Application Data

[63] Continuation of Ser. No. 691,858, Apr. 26, 1991, abandoned.

[30] Foreign Application Priority Data

Dec. 11, 1990 [KR] Rep. of Korea ............... 20286

[51] Int. Cl.[5] ............... H01L 29/78; H01L 27/14; H04N 3/14; H04N 5/335
[52] U.S. Cl. ............... 257/223; 257/222; 348/294
[58] Field of Search ............... 357/24 LR, 30 P; 257/222, 223

[56] References Cited

U.S. PATENT DOCUMENTS 4,665,422  5/1987  Hirao et al. ............... 257/292

*Primary Examiner*—Rolf Hille
*Assistant Examiner*—Robert Limanek
*Attorney, Agent, or Firm*—Robert E. Bushnell

[57] ABSTRACT

A solid-state image device for outputting the charges transferred in one direction by a transfer clock is disclosed. It has a detection port for collecting signal charges, a first active region of a first conductivity for receiving the transferred charges, a second active region of a second conductivity formed in the first active region which is connected to the detection port, and a third active region of second conductivity formed beneath the first active region which is connected to a ground voltage terminal, whereby only the transferred signal charges are amplified to produce stable output signals with large gain. The first, second and third active regions together constitute amplifying means. The second active region is supplied with current by the charging operation of a reset transistor.

16 Claims, 5 Drawing Sheets

OUTPUT TERMINAL OF A SOLID-STATE IMAGE DEVICE

This is a continuation of application Ser. No. 07/691,858 filed on Apr. 26, 1991 now abandoned.

TECHNICAL BACKGROUND

The present invention relates to an output device of a solid-state image device, particularly to an output terminal thereof.

The solid-state image device comprises a directional array of charge coupled devices (CCDs) horizontally or vertically arranged in series, whereby transferred signal charges are detected. Signals to be transferred are received by photodetectors such as photodiode. Exited electric charges by light energy are transferred through the directional array of CCDs, and an output signal is generated with amplification therefrom.

In the CCD, the charges are transferred from a potential well to adjacently potential well that is formed in a semiconductor region or channel region by applying a transfer clock to gates formed of polysilicon, isolated from the semiconductor region by insulating layer thereon, and having a given interval each other or one another.

Recently, a buried channel CCD (BCCD) is widely used, wherein the charge transfer region is formed in a semiconductor region covered with an insulating layer thereon and beneath gate electrodes. The BCCD can serve as a wide variety of electronic devices such as an image sensor, signal delay line, and in electronic apparatus using shift registers such as television cameras.

Such a BCCD has many problems to be solved in order to improve the charge transmission speed. The reliability thereof is based on the stability of the signal detected at the final output terminal. The circuit and construction concerning the output terminal of a BCCD is disclosed in "SOLID-STATE IMAGE DEVICE" published on March 26, Japan Sho Whoa 61-9975, "IEEE TRANSACTION ON ELECTRON DEVICE" VOL. 36, NO2, PP 360–366, FIGS. 1 and 8, published in February, 1989.

The above two prior construction employ reset transistors at the output terminal. FIGS. 1, 2A and 2B attached to this specification respectively represent a cross sectional view of the prior constructions, equivalent circuit thereof, and the output waveforms thereof.

Referring to FIGS. 1, 2A and 2B, there is formed in a P well 2 on a substrate an N-type layer 3 which embeds a potential forming N− diffusion region 4 formed under a transfer gate 8, and N+ diffusion regions 5 and 6 constituting the source and drain of a field effect transistor. Namely, the N+ diffusion regions 5 and 6 and a reset gate 11 all together constitute an N-type reset transistor 576. Between the reset gate 11 and transfer gates 8 and 9 is arranged a pass gate 10 connected to pass voltage $V_{OG}$.

The N+ diffusion region 5 that is the source of the N− type reset transistor 576 serves the output terminal of the BCCD, whose signal is amplified through a source follower amplifier 20 to produce final output $V_{out}$. The P-type well 2 and the N-type layer 3 of channel transfer region constitute a PN junction diode 25, of which cathode (N-type layer) is connected to the source 5 of the N-type reset transistor 576 and anode (P--type well) to ground voltage, as shown in FIG. 2A.

Also there exists a resistance 12 between the diode 25 and ground voltage. A detection port 53 is between the source 5 of the N-type reset transistor 576 and the cathode 3 of the diode 25. The input current $I_{IN}$ introduced to the detection port 53 is determined by the potential $V_{IN}$ of the transferred charges, and the signal applied from the detection port 53 to the source follower amplifier 20 varies with the clamping characteristic of the diode 25 and the on/off operation of the N-type reset transistor 576. The source follower amplifier 20 is a current-mirror-type amplifier comprised of two NMOS transistors 21 and 22 connected to internal voltage terminal $V_{DD}$, and of two ground connected transistors 23 and 24. The above described BCCD detection circuit having the diode 25 between the detection port 53 and ground voltage terminal is called a floating-diode amplifier (FDA).

Referring to FIG. 2B, if a transfer clock $\phi_H$ become "high" at time $t_1$, the transferred charges type layer (channel region) time $t_2$ if high level of a reset pulse $\phi_{RG}$ (about 8–15 V is applied to the reset gate 11, the reset transistor 576 is turned on so that the output voltage $V_{OUT}$ of about $V_{DD}$ is produced through the source follower amplifier 20. Thereafter, at time $t_3$ if the reset pulse $\phi_{RG}$ become "low" the electrons formed in the channel region 7 between the N+ diffusion regions 5 and 6 return to the N+ diffusion regions 5 and 6 so that the output voltage $V_{OUT}$ is dropped. This is called "feedthrough", and the output level is called "feedthrough level".

Assuming that the quantity of the signal charges is $Q_o$, the capacitance between the detection port 53 and P-type well 2 (or PN junction capacitance) C, the voltage gain of the source follower amplifier $A_v$, and the transfer conductance of the amplifying MOS transistor in the source follower amplifier gm, the output voltage gain $\Delta V$ is expressed as follows:

$$\Delta V = A_v \Delta V_A = (Q_o/C) \cdot gmR/(1+gm\,R) \ldots \quad (1)$$

wherein $\Delta V_A$ indicates the feedthrough level shown in FIG. 2B, and R the value of the resistance 12 shown in FIG. 2A. As a result, that the output voltage $V_{OUT}$ is dropped due to the feedthrough is caused by the fact that the charges formed in the channel 7 are partly distributed to the parasitic capacitor of the PN junction. Namely, as the PN junction capacitance C is increased, the output voltage gain $\Delta V$ is decreased. Moreover, it is advantageous that the quantity $Q_o$ of the signal charges applied to the detection port 53 is great, for the source follower amplifier may critically respond to the general frequency noises if the quantity is small.

Further, in the above circuit, kTC noises (reset noises) are mixed with the output signal because of the switching operation of the reset transistor. The kTC noises are caused by the electron energy fluctuation that is in turn caused by the fact that when the reset pulse kept to be in the high voltage of about 15V for a brief time is dropped to 0V they are switched with a large swing width so that the electrons in the channel 7 return to the N+ diffusion regions 5 and 6 (or source and drain regions). The kTC noises are small in magnitude, but considerably influence the transferred signal of insufficient quantity. Description concerning the kTC noises (reset noises) are disclosed in the above "SOLID-STATE IMAGE DEVICE", pp 140–145.

SUMMARY OF THE INVENTION

It is an object of the present invention to provide an output terminal of a solid-state image device using BCCD, whereby the output terminal produces stabilized output signals.

It is another object of the present invention to provide an output terminal of a solid-state image device which may produce output signal charges of sufficient quantity without using an external amplifying means.

According to the present invention, a solid-state image device for outputting the charges transferred in one direction by given transfer clock comprises a detection port for finally providing signal charges, a first active region of first conductivity for receiving the transferred charges, a second active region of second conductivity formed in the first active region, with being connected to the detection port, and a third active region of second conductivity formed beneath the first active region, with being connected to ground voltage terminal.

BRIEF DESCRIPTION OF ATTACHED DRAWINGS

The foregoing and other objects, aspects and advantages of the invention will be better understood from the following detailed description of the preferred embodiment of the invention with reference to the accompanying drawings, in which.

DETAILED DESCRIPTION OF A PREFERRED EMBODIMENT OF THE PRESENT INVENTION

Figure 1:
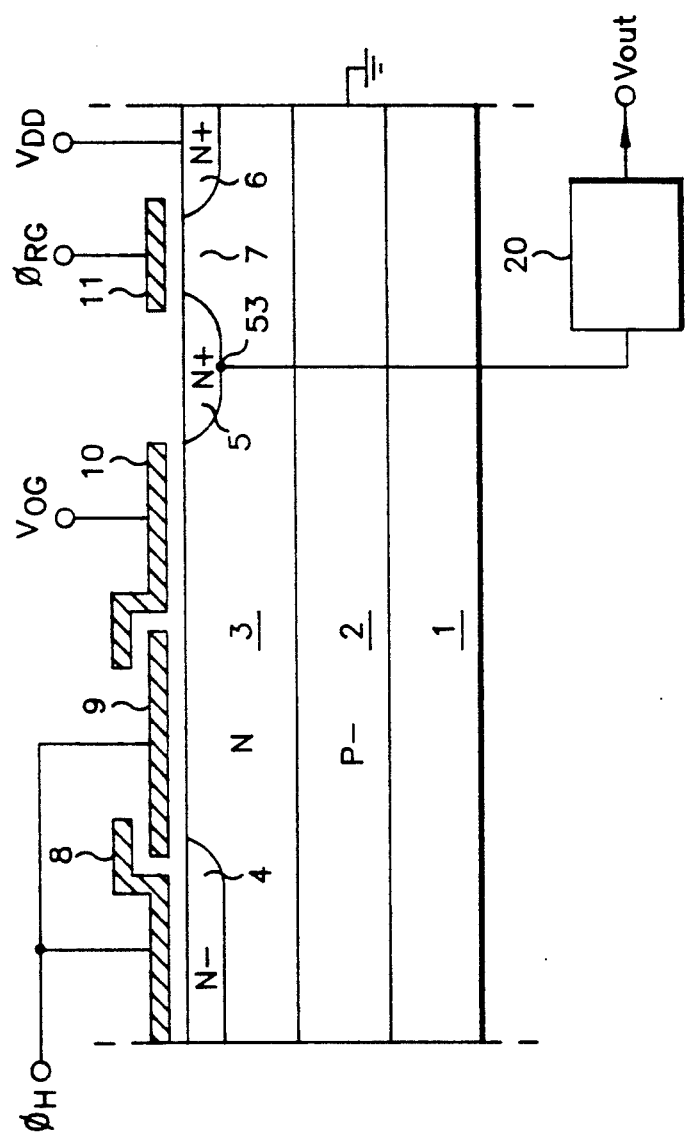
FIG. 1 is a cross sectional view of the structure of the output section of a conventional BCCD.
Figure 2A:
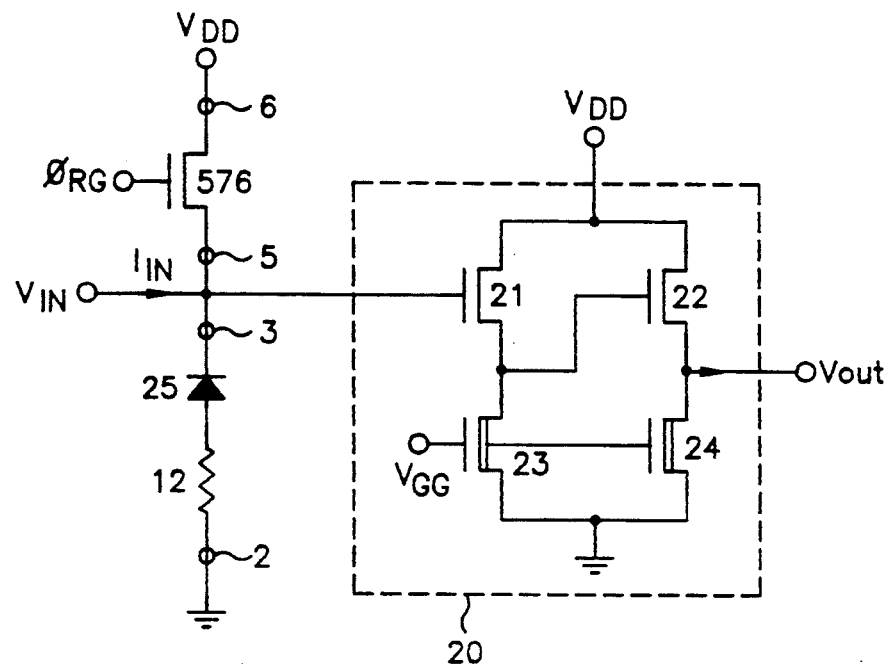
FIG. 2A is an equivalent circuit according to FIG. 1.
Figure 2B:
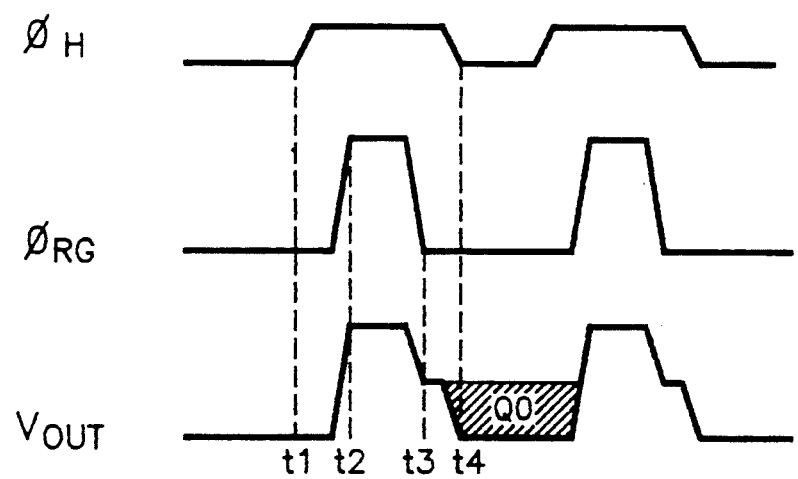
FIG. 2B illustrates the operational waveforms of the conventional circuit of FIG. 1.
Figure 3:
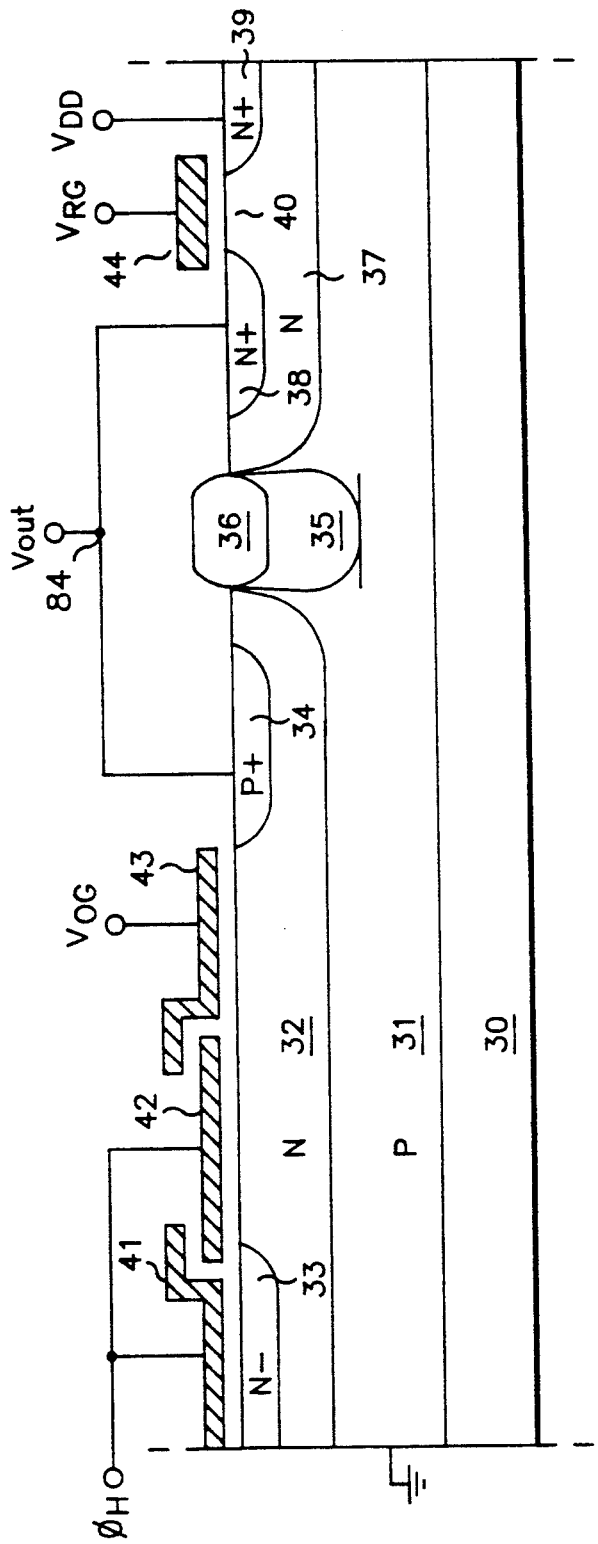
FIG. 3 is a cross sectional view of the structure of the output section of a BCCD according to the present invention.

Referring to FIG. 3, substrate 30, P-type well 31 (or possibly epitaxial layer), left N layer 32, P+diffusion region 33 for forming a potential, transfer gates 41 and 42, and pass gate 43 are same as those of FIG. 1. The P+diffusion region 34 and N+ diffusion region 38 respectively formed in the left N layer 32 and right N layer 37 are commonly connected to voltage output terminal $V_{OUT}$. The left N layer 32 and right N layer 37 are separated by both isolation oxide layer 36 and P+ channel stopper region 35 beneath it. Within a part of the topmost of the right N layer 37, with a given depth, are formed the N+ diffusion region 38 and another N+diffusion region 39 that constitute an NMOS transistor with a reset gate 44. The P-type well 31, left N layer 32 and P+ diffusion region 34 constitute a PNP bipolar transistor. The left N layer 32 serves both the channel transfer region and the base of the PNP bipolar transistor.

Figure 4:
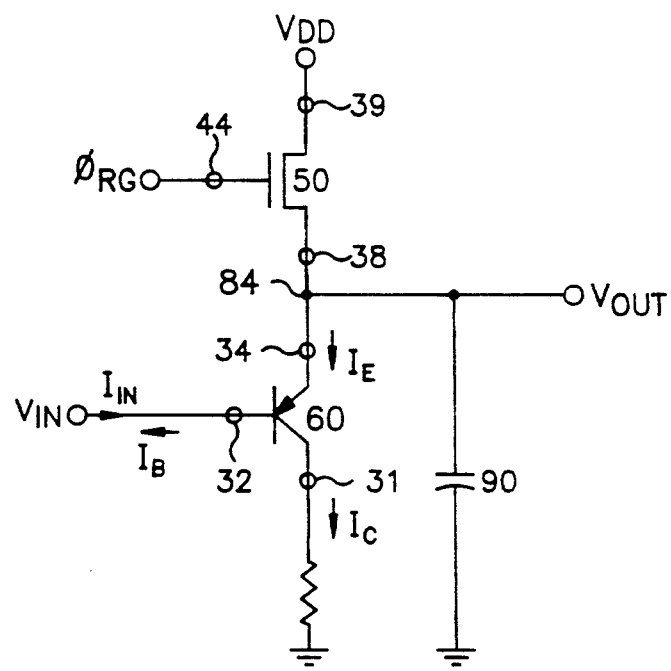
FIG. 4 is an equivalent circuit according to FIG. 3.

Referring to FIG. 4, the inventive detection circuit comprises a reset transistor 50, PNP bipolar transistor 60, resistance 70, detection port, and coupling capacitor 90. The reset transistor 50 consists of a reset gate 44, source and drain regions of N+diffusion regions 38 and 39, and channel region 40, as shown in FIG. 3.

The PNP bipolar transistor 60 consists of the P-type well 31, channel transfer region of the left N layer 32 and P+ diffusion region 34, as shown in FIG. 3. The resistance 70 is a parasitic resistance formed between the P-type well 31 and ground voltage terminal.

The detection port 84 commonly is connected to both the P+diffusion region 34 and the N+diffusion region 38, as shown in FIG. 3, to finally detect the output voltage. The coupling capacitor 90 exists between lines or between lines and lower conduction layer when extending an output line, and is an important factor for determining the characteristics of the inventive detection circuit. The output voltage Vo varies with the charges accumulated in the coupling capacitance 90.

Figure 5:
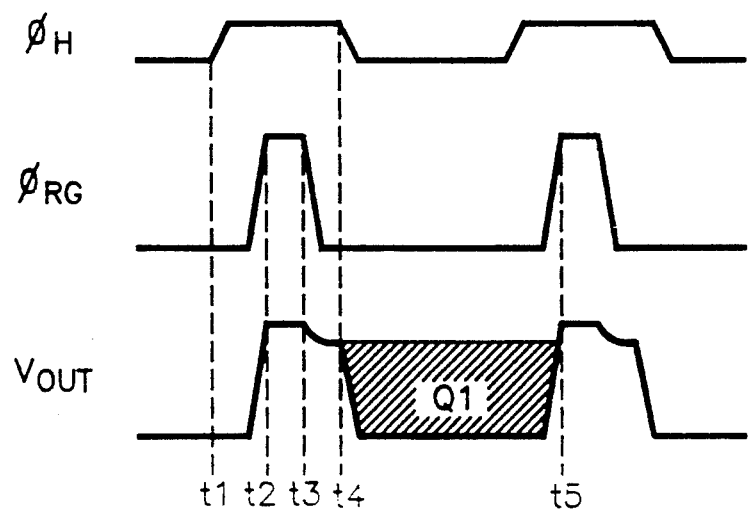
FIG. 5 illustrates the operational waveforms of the inventive circuit.
Figure 6:
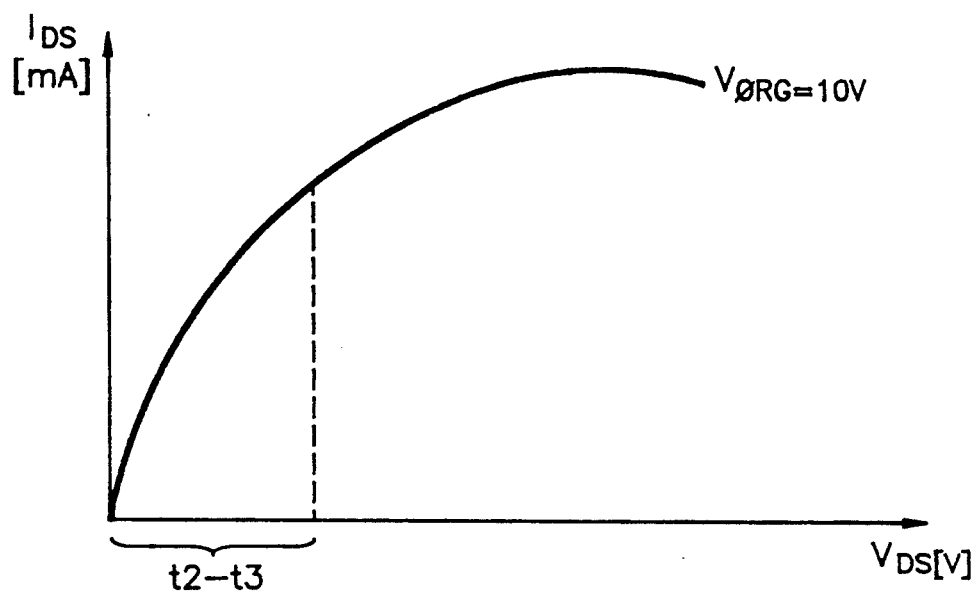
FIG. 6 is a graph for illustrating the current-voltage characteristics of the reset transistor 50 of FIG. 4.
Figure 7:
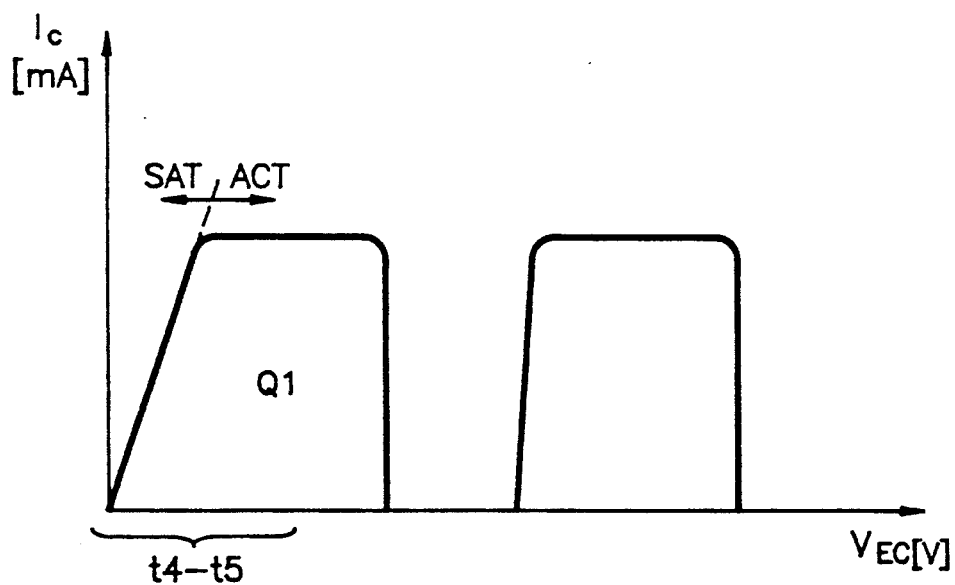
FIG. 7 is a graph for illustrating the current-voltage characteristics of the PNP bipolar transistor 60 of FIG. 4.

Referring to FIG. 5, the relationship between the transfer clock $\phi_H$, a reset pulse $\phi_{RGj}$ and output voltage $V_{OUT}$ is illustrated with reference to times $t_1$, $t_2$, $t_3$, $t_4$ and $t_5$ respectively indicating time of enabling of the transfer clock $\phi_H$, enabling of the reset pulse $\phi_{RG}$, disabling of the reset pulse $\phi_{RG}$, disabling of the transfer clock $\phi_H$ and setting up of the output voltage $V_{OUT}$ in the next page Referring to FIG. 6 for illustrating the voltage $V_{DS}$ characteristics of current $I_{DS}$ when the reset pulse $\phi_{RG}$ of 10 to 15V are applied to the reset transistor 50, a linear drain-source current $I_{DS}$ flows in the source 38 of the reset transistor 50 connected to the detection port 84 because of high level of the reset pulse $\phi_{RG}$. This current charges the coupling capacitor 90 for the time $t_2-t_3$ of applying the reset pulse $\phi_{RG}$.

Referring to Fig, 7 for illustrating the amplification of the PNP bipolar transistor 60 according to the present invention, the region $Q_1$ enclosed by the curve illustrating relation between the collector emitter voltage $V_{CH}$ and the collector current $I_c$ for the time $t_4-t_5$ of amplification represents the amount of the output current amplified by the current (emitter current of the PNP bipolar transistor) discharged from the coupling capacitor 90, Hereinafter will now be described the operation of the inventive circuit, based on the above description.

At time $t_1$ if the transfer clock $\phi_H$ is "high" the transferred charges are delivered to the channel under the gate 42. Thereafter, at time $t_2$ when the reset pulse $\phi_{RG}$ of 10-15V are applied to the reset gate 44 of the reset transistor 50, the reset transistor is made greatly conductive, so that the drain-source current $I_{DS}$ is increased with good linearity, As shown in Fig, 6, since the voltage source (10 to 15V) of the reset pulses $\phi_{RG}$ meets the condition $V_{GS}-V_{TN}>V_{DS}$ ($V_{OS}$: gate voltage, namely the voltage of the reset pulses $\phi_{RG}$; $V_{DS}$: drain-source voltage; and $V_{TM}$: threshold voltage), great amount of current flows to the detection port 84 connected to the source 38 to the saturation point of $V_{GS}-V_{TN}=V_{DS}$ during the time ($t_2-t_3$) that the reset pulse $\phi_{RG}$ is applied, The current obtained by the reset transistor 50 charges the coupling capacitor 90 existing in the detection port 84, so that the level of the output voltage $V_{OUT}$ across the coupling capacitor 90 is increased.

Then, at time $t_3$ if the reset pulse ere are disabled, the drain-source current $I_{DS}$ of the reset transistor 50 begins to be decreased with somewhat lowering the level of the output voltage $V_{OUT}$. This is a feedthrough phenomenon occurring when the charges formed in the channel region 40 of the reset transistor 50 with the applied reset pulse $\phi_{RG}$ are absorbed by both the N+ diffusion regions 38 and 39 shown in FIG. 3. The feedthrough level is relatively reduced compared with the conventional circuit.

If there is blocked the charging passage between the internal voltage source $V_{DD}$ and detection port 84 due to disabling of the reset pulse $\phi_{RG}$, the coupling capacitor 90 starts to discharge the previously charged voltage.

The current by the discharging of the capacitor 90 directly becomes the emitter current $I_B$ of the PNP bipolar transistor 60, thus operating it. The PNP bipolar transistor 60 starts to operate at the moment when the transfer clock pulses $\phi_H$ are disabled at time $t_4$ so as to cause the charges captured under the gate 42 to be consumed as the base current $I_B$ of the PNP bipolar transistor 60 and the emitter current $I_E$ starts to be introduce into the detection port 84 by discharging of the coupling capacitor 90.

Referring to Fig: 7, since thump bipolar transistor 60 operates in the active region ACT, the emitter-collector voltage $V_{BC}$ is considerably increased even with a large collect current $I_C$. The reason is that the emitter-base junction of the PNP bipolar transistor 60 is forwardly biased and base-collector junction is reversely biased.

Thereafter, if the emitter-collector junction is reversely biased, $V_{BC}$ becomes equal to $V_{BB}+V_{BC}$, so that the PNP bipolar, transistor 60 operates in the active region ACT of increasing $V_{BC}$.

Thus the PNP bipolar transistor 60 amplifies the signal charges and the transferred charges collected in the base are all consumed, and then the PNP bipolar transistor 60 is turned off to stand-by-situation.

The charges transferred by one pulse of transfer clock pulse $\phi_{RBj}$ reduced by one to the amplification factor $\beta(I_c/I_B)$ of the PNP bipolar transistor 60.

It will be apparent to one skilled in the art that the sufficiently amplified signal charges are hardly influenced by the frequency noises generated at the output terminal.

The present embodiment employs the PNP bipolar transistor 60 as the amplifying means, but it is possible to use other devices applicable to the structure of FIG. 3 for accomplishing the present invention.

As described above, the present invention makes it possible to amplify the signal charges transferred to the final stage of a BCCD to obtain stable output signals without using an external amplifier, thus improving the integrability of a solid-state image device.

Furthermore the present invention amplifies only the transferred signal charges by means of least component elements, so that the final output signal is hardly influenced by the noises of the output terminal.

What is claimed is:

1. A solid-state image device, comprising:
   a semiconductor substrate;
   a first active layer being a collector of a bipolar transistor, said first active layer having a first conductivity type formed on said semiconductor substrate;
   a second active layer having a second conductivity type formed on said first active layer, for transferring first electric charges corresponding to an emitter current of the bipolar transistor and second electric charges corresponding to a drain-source current of a metal oxide semiconductor field effect transistor, said second active layer having a first portion being a base of the bipolar transistor and a second portion separated from the first portion by a stopper region;
   a first active region being an emitter of the bipolar transistor, said first active region having a doped material of said first conductivity type disposed as a well form in a first selected area of said first portion of said second active layer facing toward said stopper region;
   a second active region being a source of the metal oxide semiconductor field effect transistor and a third active region being both a drain of the metal oxide semiconductor field effect transistor and an internal voltage source, said second and third active regions each disposed as a well form having a doped material of said second conductivity type within a second selected area of said second portion of said second active layer, said second active region facing toward said stopper region and being spaced-apart from said third active region by a channel region;
   a plurality of spaced-apart gate electrodes disposed over said first portion of said second active layer, for providing sad first electric charges and said second electric charges in dependence upon a transfer clock by transferring said first electric charges to said first active region via the first portion of the second active layer and by transferring said second electric charges to said second active region via the second portion of said second active layer;
   a reset gate of the metal oxide semiconductor field effect transistor partially situated over said second and third active regions of said second portion of said second active layer, for activating the metal oxide semiconductor field effect transisor in response to a reset clock pulse corresponding to said transfer clock pulse; and
   an output terminal connected to said first and second active regions, for providing a stabilized output voltage by providing said output voltage corresponding to said second electric charges when said transfer clock pulse is high, said rest pulse is high, said bipolar transistor is off, and said metal oxide semiconductor field effect transistor is one, and for providing the output voltage corresponding to said first electric charges when said transfer block pulse is low, said reset pulse is low, said metal oxide transistor is off and said bipolar transistor is on.

2. The solid-state image device of claim 1, further comprised of said channel region of said second portion of said second active layer providing a current path connectable between said output terminal and an internal voltage source, for controlling said current path in dependence upon said reset clock pulses having a given voltage level.

3. The solid-state image device of claim 1, wherein said first conductivity type is a positive type and said second conductivity type is a negative type.

4. A solid-state image device, comprising:
   a semiconductor substrate;
   a negative metal oxide semiconductor field effect transistor having source and drain regions separated by a channel region formed on said semiconductor substrate and a reset gate overlying sand insulated from said channel region, said negative metal oxide semiconductor field effect transistor being activated by a reset clock pulse via said reset gate overlying and insulating from said channel region.

a bipolar positive-negative-positive transistor having collector, base and emitter regions respectively formed on said semiconductor substrate and coupled to receive a transfer clock pulse representative of electric charges, for amplifying said electric charges when said negative metal oxide semiconductor field effect transistor is not activated; and detection means connected to said source region of said negative metal oxide semiconductor field effect transistor and said emitter region of said bipolar positive-negative-positive transistor, for detecting said amplified electric charges from said bipolar positive-negative-positive transistor to provide detected electric charges in dependence upon said reset clock pulse.

5. An output voltage stabilizing solid-state image device using buried-channel charge coupled devices, comprising:

a semiconductor substrate;

a first active layer adjacent to said substrate;

a second active layer adjacent to said first active layer, said second active layer comprising a first section for providing a firs electrical charge and a second section providing a second electric charge, said first and second sections separated by a stopper region;

a transfer electrode disposed over said first section for controlling said first electric charge when a transfer pulse is high;

a first active region disposed as a well form in the first section and connected to an output terminal;

a second active region disposed as a well form in the second section and connected to the output terminal;

a third active region disposed as a well form in the second section and connected to an internal voltage terminal, said third active region providing an internal voltage of said internal voltage terminal;

a channel separating said second and third active regions;

a reset gate disposed over said channel, a portion of said second active region, and a portion of said third active region for controlling said second electric charge when a reset pulse is high;

a field effect transistor comprising a source being the second active region, a drain being the third active region, and a gate being the reset gate, said field effect transistor amplifying when operating by producing a drain-source current corresponding to the second electric charge to charge a capacitor at the output terminal when the transfer pulse is high and the rest pulse is high, said field effect transistor no operating when said reset pulse is not high; and a bipolar transistor comprising a collector being the first active layer, a base being said first section, and an emitter being said first active region, said bipolar transistor amplifying when operating by providing a collector current corresponding to said first electric charge and responsive to discharging of said capacitor when said transfer pulse is low, said rest pulse is low, and said field effect transistor is not operating.

6. The solid-state image device of claim 5, further comprising feedthrough means for reducing a reset noise and minimizing reduction in the output voltage by producing the output voltage due to feedthrough when the transfer pulse is high, the reset pulse is not high, said field effect transistor is not operating, and said bipolar transistor is not operating.

7. An amplification method of the solid-state image device of claim 5, for stabilizing amplification corresponding to the output voltage, said method comprising the steps of:

generating a high said transfer pulse at a first time, causing said bipolar transistor to turn off;

generating a high said reset pulse at a second time, causing the field effect transistor to turn on, charging the capacitor by providing a drain-source current, and producing said output voltage;

removing the high said reset pulse at a third time, causing the field effect transistor to turn off, and producing the output voltage via feedthrough; and removing the high said transfer pulse at a fourth time, causing the bipolar transistor to turn on, discharging the capacitor by producing the collector current, and producing the output voltage via said discharging of the capacitor.

8. The method of claim 7, wherein said step of amplifying the image signal during a second time period further comprises reducing a reset noise and minimizing reduction in the output voltage during feedthrough.

9. An amplification method of the solid-state image device of claim 5, for stabilizing amplification corresponding to the output voltage, said method comprising the steps of:

amplifying an image signal during a first time period, when the field effect transistor is on and the bipolar transistor is off, by producing the drain-source current in the field effect transistor in response to both the transfer pulse and the reset pulse being high;

amplifying the image signal during a second time period, when the transfer pulse is high, the rest pulse is not high, the bipolar transistor is off, and the field effect transistor is off, by producing the output voltage due to feedthrough; and amplifying the image signal during a third time period, when the transfer pulse is not high, the reset pulse is not high, the field effect transistor is off, and the bipolar transistor is on.

10. The method of claim 9, wherein said step of amplifying the image signal during a second time period further comprises reducing a reset noise and minimizing reduction of the output voltage during feedthrough.

11. A solid-state image device, comprising:

a substrate;

a first active layer of a first conductivity type formed on said substrate;

a second active layer of a second conductivity type formed on said first active layer, said second active layer having first and second portions separated and spaced-apart by a stopper region;

a first diffusion region disposed within said first portion of said second active layer, said first active layer, said first portion of said second active layer and said first diffusion region forming a first transistor for amplifying electric charges in dependence upon a transfer clock pulse;

second and third diffusion regions each disposed within said second portion of said second active layer, said second diffusion region being separated and spaced-apart from said third diffusion region by a channel region, said second and third diffusion regions and said channel region forming a second transistor for regulating amplified electric charges provided from said first transistor in dependence upon a reset clock pulse;

a transfer gate electrode disposed over said first portion of said second active layer and coupled to receive said transfer clock pulse, for controlling operation of said first transistor, a reset gate electrode disposed over said channel region and coupled to receive said reset clock pulse, for controlling operation of said second transistor, and an output terminal connected to said first and second diffusion regions, for providing a stabilized output voltage corresponding to the amplified electric charges when said second transistor is turned-off.

12. The solid-state image device as claimed in claim 11, wherein said first conductivity type is a P-type, said second conductivity type is a N-type, said first diffusion region is formed by P+type materials, and said second and third diffusion regions are formed by N+ type materials.

13. The solid-state image device as claimed in claim 11, wherein said first transistor is a bipolar transistor, sand said first active layer, said first portion of said second active layer and said first diffusion region correspond to a collector, a base and an emitter of said bipolar transistor, respectively.

14. The solid-state image device as claimed in claim 11, wherein said second transistor is a field effect transistor, and said second and third diffusion regions and said reset gate electrode correspond to a source, a drain and a gate of said field effect transistor, respectively.

15. A solid-state image device, comprising:

a substrate;

a transfer transistor formed on said substrate, said transfer transistor having a collector region, a base region and an emitter region respectively formed on said substrate, for transferring and amplifying electric charges;

a transfer gate disposed over said base region of said transfer transistor and coupled to receive transfer clock pulses, for controlling operation of said transfer transistor in dependence upon said transfer clock pulses;

a reset transistor disposed on said substrate, said reset transistor having a source region, a drain region and a channel region respectively disposed on said substrate, for regulating amplified electric charges provided from said transfer transistor;

a reset gate disposed over said channel region of said reset transistor and coupled to receive said reset clock pulses, for controlling operation of said reset transistor; and means connected to said source region of said reset transistor and said emitter region of said transfer transistor, and providing a stabilized output voltage corresponding to the amplified electric charges when said reset transistor is turned-off.

16. The solid-state image device as claimed in claim 15, wherein said first conductivity type is a P-type, said second conductivity type is a N-type, said first diffusion region is formed by materials of P+type, and said second and third diffusion regions are formed by materials of N+type.

* * * * *